United States Patent [19]

Nakajima

[11] Patent Number: 5,565,797
[45] Date of Patent: Oct. 15, 1996

[54] CLOCK SIGNAL GENERATING DEVICE

[75] Inventor: Masao Nakajima, Kawasaki, Japan

[73] Assignee: Fujitsu Limited, Kawasaki, Japan

[21] Appl. No.: 512,222

[22] Filed: Aug. 7, 1995

[30] Foreign Application Priority Data

Nov. 30, 1994 [JP] Japan ................................. 6-297282

[51] Int. Cl.⁶ ............................................. H03K 19/096
[52] U.S. Cl. ............................ 326/93; 326/46; 327/160; 327/162
[58] Field of Search ........................ 326/46, 93, 96; 327/141, 155, 160, 162

[56]  References Cited

U.S. PATENT DOCUMENTS

| | | | |
|---|---|---|---|
| 4,821,296 | 4/1989 | Cordell | 375/119 |
| 5,347,559 | 9/1994 | Hawkins et al. | 377/54 |
| 5,379,325 | 1/1995 | Katayama et al. | 326/93 X |
| 5,452,323 | 9/1995 | Rosen | 326/93 X |

FOREIGN PATENT DOCUMENTS 222727  8/1995  China.

OTHER PUBLICATIONS

First Office Action of Application No. 84108241 Filed Aug. 8, 1995 in R.O.C. and and English Translation thereof.

*Primary Examiner*—David R. Hudspeth
*Attorney, Agent, or Firm*—Armstrong, Westerman Hattori, McLeland & Naughton

[57]  ABSTRACT

A device for generating a clock signal includes: a timer unit for generating a period signal that indicates a period defined on the basis of a reference clock and a period control signal; an output unit for reversing an output level thereof in response to the period signal generated by the timer unit and providing a resultant output as a clock signal; and a control unit for producing the period control signal according to the clock signal output from the output unit and controlling the timing of generation of the period signal for the timer unit. A cycle of the clock signal output from the output unit is controlled using the period control signal, so that the cycle corresponds to an odd number of pulse spacings of the reference clock. Owing to this configuration, a deviation of an actual output frequency from a desired output frequency relative to an identical input clock can be minimized, and thus a high-precision output clock can be provided.

5 Claims, 20 Drawing Sheets

NORMAL MODE (EVEN-NUMBER MODE)

ODD-NUMBER MODE (CONTROL FORM 1)

ODD-NUMBER MODE (CONTROL FORM 2)

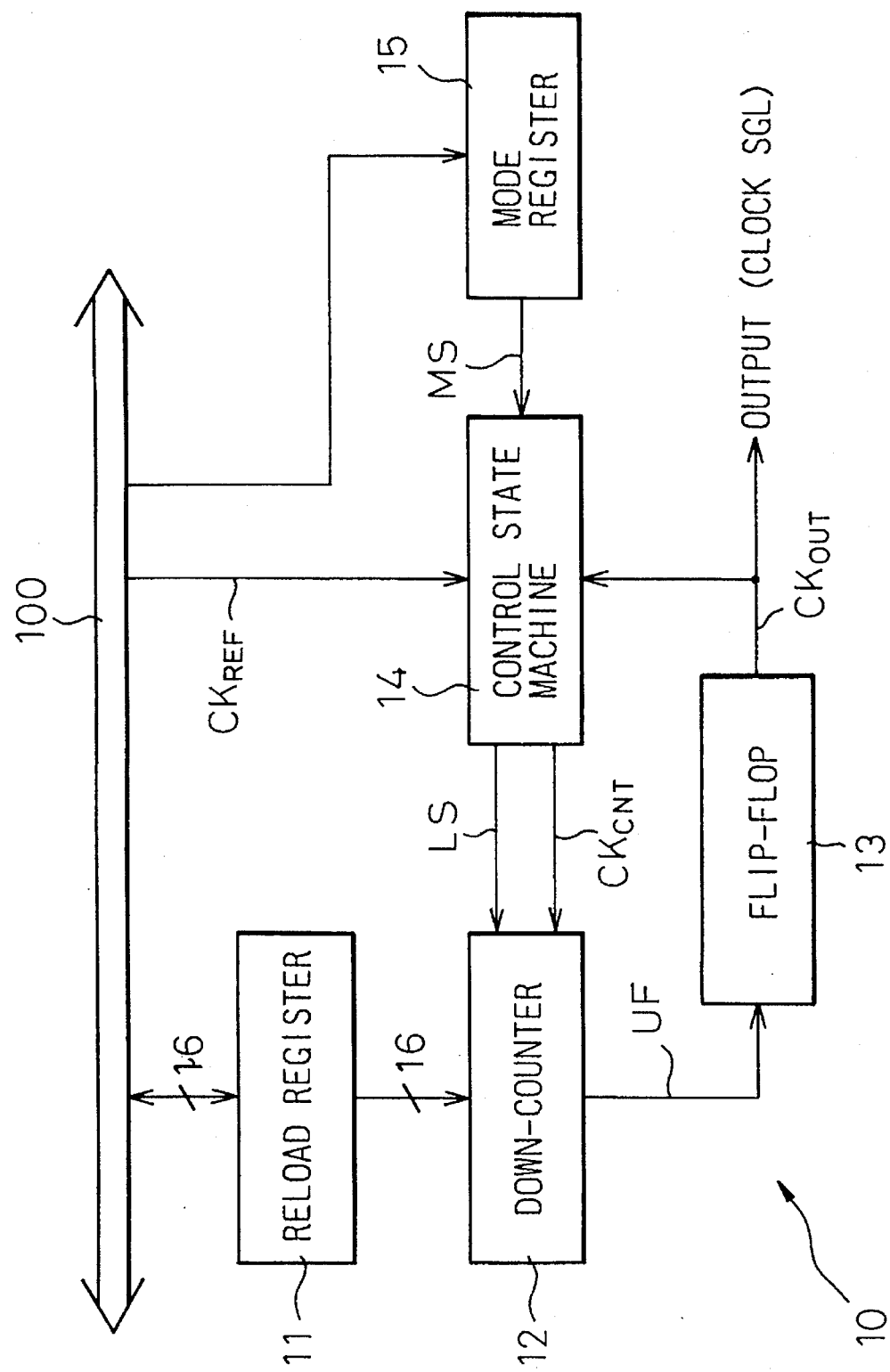

① ··· START
② ··· OUTPUT "1" IN ODD-NUMBER MODE
③ ··· OUTPUT "0" IN ODD-NUMBER MODE OR
   IN NORMAL MODE
④ ··· all
⑤ ··· VALUE OF COUNTER IS OTHER THAN "0"
⑥ ··· VALUE OF COUNTER IS "0"
LOAD ··· FEED LOAD SGL TO COUNTER
COUNT ··· FEED COUNT-CLOCK TO COUNTER ① ··· START
② ··· OUTPUT "0" IN ODD-NUMBER MODE
③ ··· OUTPUT "1" IN ODD-NUMBER MODE OR IN NORMAL MODE
④ ··· all
⑤ ··· VALUE OF COUNTER IS DIFFERENT FROM THAT OF COMPARISON REGISTER
⑥ ··· VALUE OF COUNTER IS EQUAL TO THAT OF COMPARISON REGISTER
RESET ··· FEED RESET SGL TO COUNTER
COUNT ··· FEED COUNT-CLOCK TO COUNTER

Fig.10

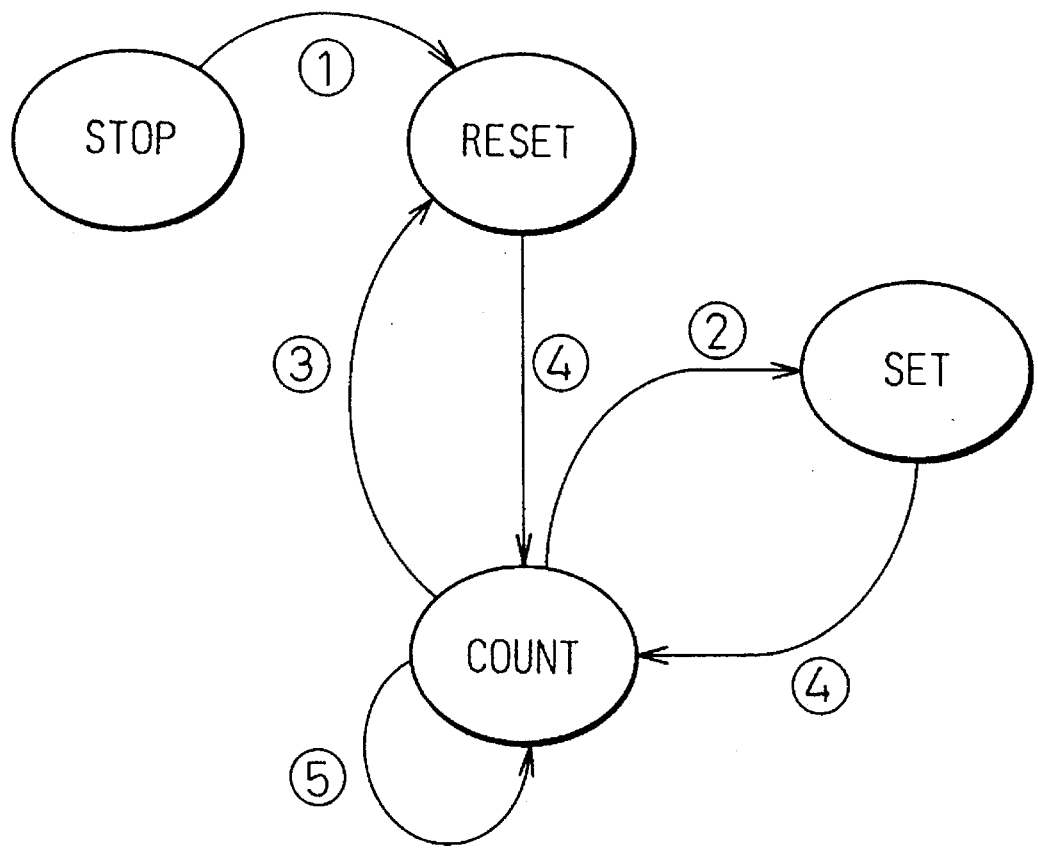

① ··· START
② ··· VALUE OF COUNTER IS EQUAL TO THAT OF COMPARISON REGISTER, AND OUTPUT "1" IN ODD-NUMBER MODE
③ ··· VALUE OF COUNTER IS EQUAL TO THAT OF COMPARISON REGISTER, AND OUTPUT "0" IN ODD-NUMBER MODE OR IN NORMAL MODE
④ ··· all
⑤ ··· VALUE OF COUNTER IS DIFFERENT FROM THAT OF COMPARISON REGISTER
RESET ··· FEED RESET SGL TO COUNTER
SET ··· FEED SET SGL TO COUNTER
COUNT ··· FEED COUNT-CLOCK TO COUNTER

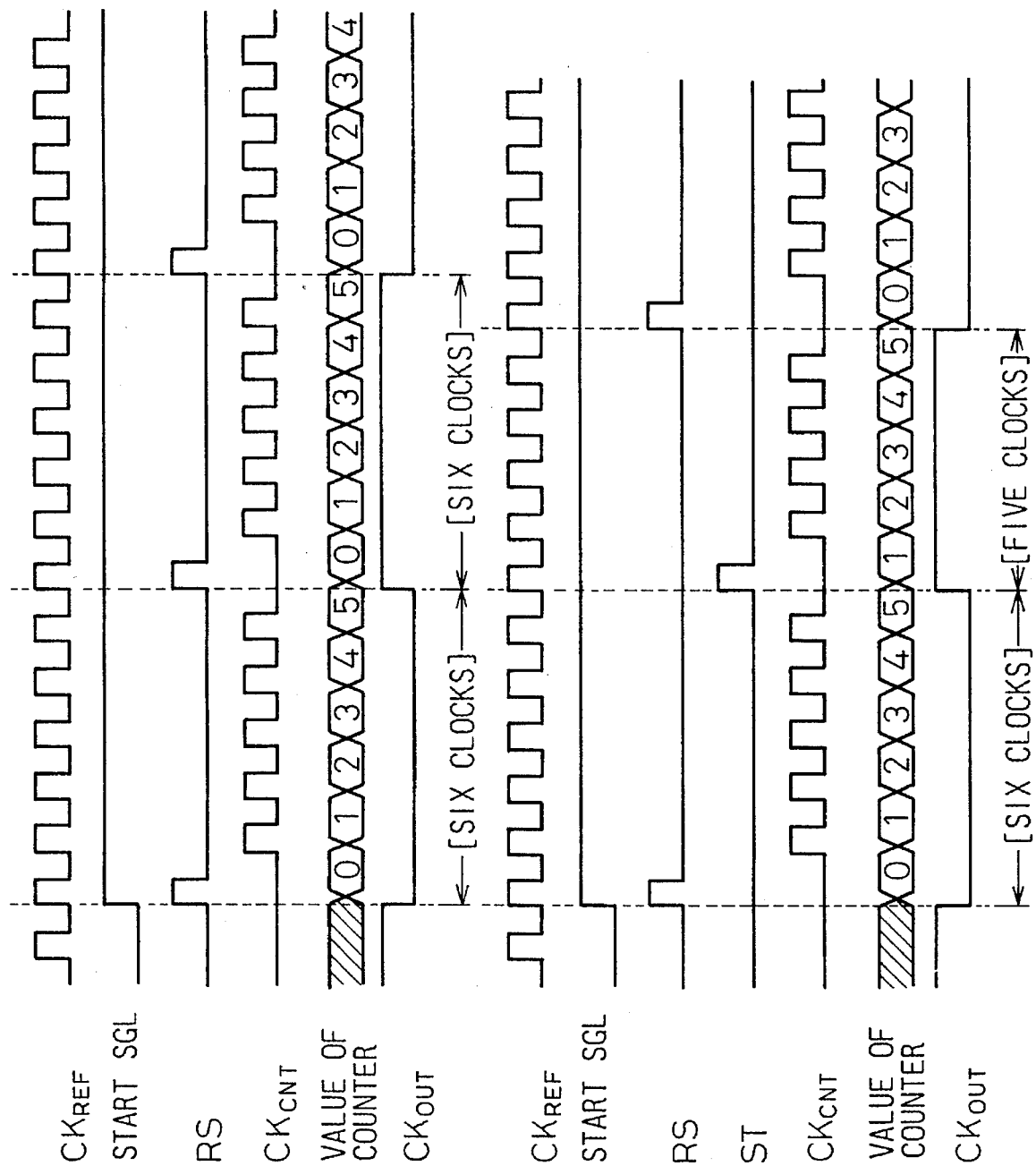

① ··· START
② ··· VALUE OF COUNTER IS "0", AND OUTPUT "1" IN ODD-NUMBER MODE
③, ⑥ ··· VALUE OF COUNTER IS "0", AND OUTPUT "0" IN ODD-NUMBER MODE OR IN NORMAL MODE
④ ··· all
⑤ ··· VALUE OF COUNTER IS OTHER THAN "0"
LOAD ··· FEED LOAD SGL TO COUNTER, AND MOD. SGL → "0"
MODIFY ··· FEED LOAD SGL TO COUNTER, AND MOD. SGL → "1"
COUNT ··· FEED COUNT-CLOCK TO COUNTER Fig.14a NORMAL MODE Fig.14b ODD-NUMBER MODE

Fig.16

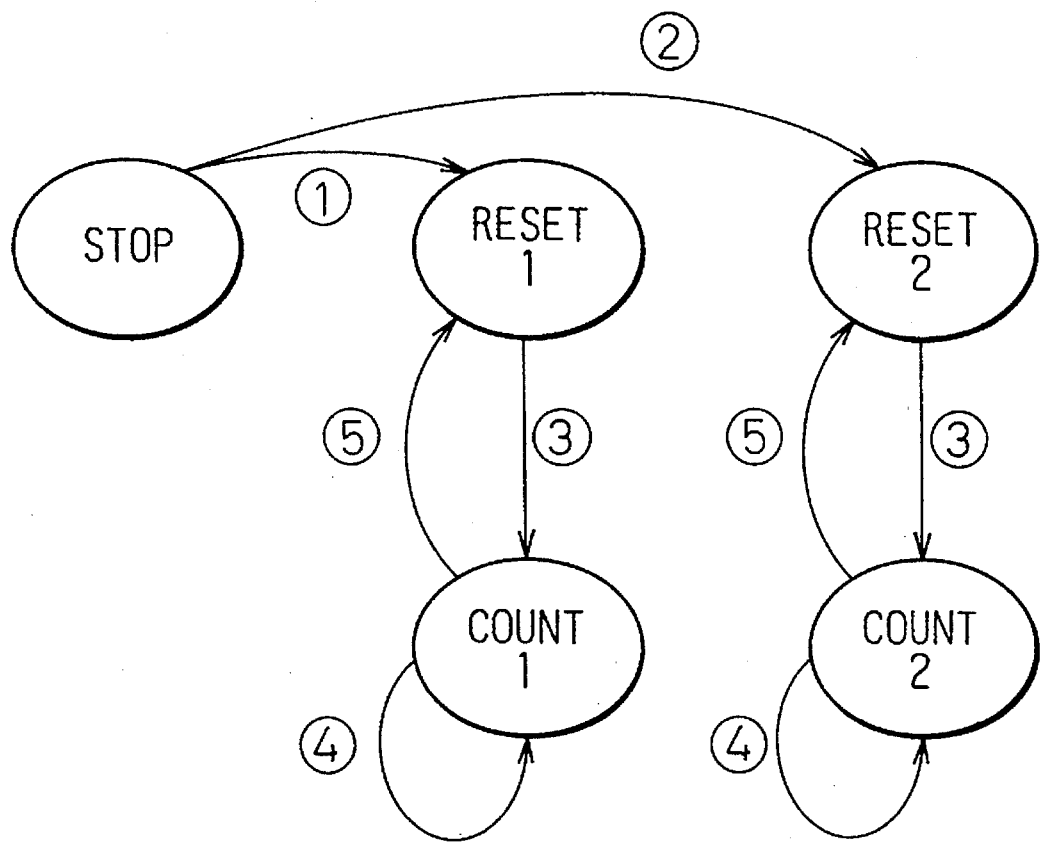

① ··· START (NORMAL MODE)
② ··· START (ODD-NUMBER MODE)
③ ··· all
④ ··· RESULT OF COMPARISON INDICATES NON-COINCIDENCE
⑤ ··· RESULT OF COMPARISON INDICATES COINCIDENCE
RESET 1 ··· FEED RESET SGL TO COUNTER, AND MOD. SGL→"0"
RESET 2 ··· FEED RESET SGL TO COUNTER, AND MOD. SGL→"1"
COUNT 1 ··· FEED COUNT-CLOCK TO COUNTER, AND MOD. SGL→"0"
COUNT 2 ··· FEED COUNT-CLOCK TO COUNTER, AND MOD. SGL→"1"

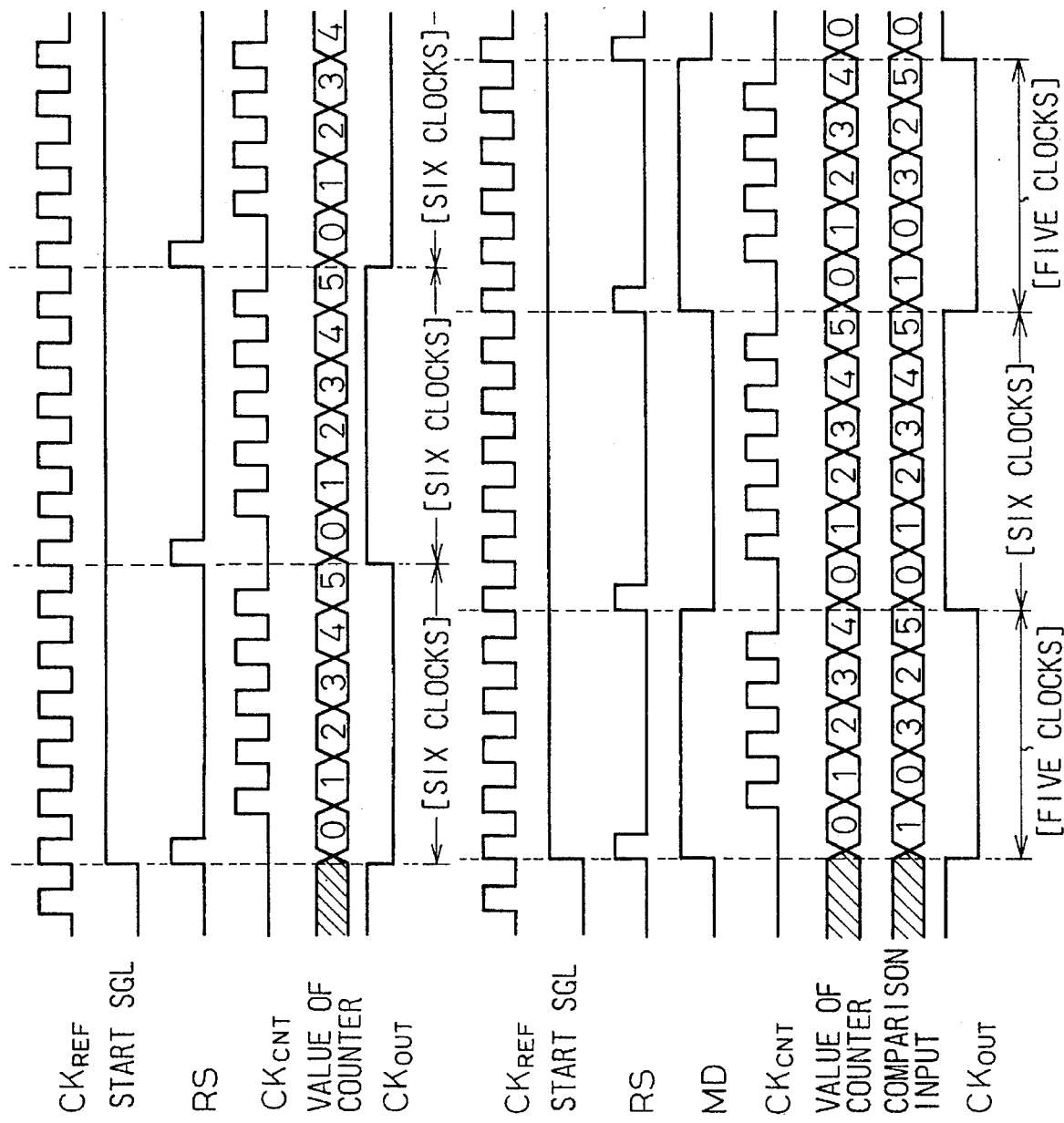
Fig.17a NORMAL MODE
Fig.17b ODD-NUMBER MODE

① ··· START (NORMAL MODE)
② ··· START (ODD-NUMBER MODE)
③ ··· all
④ ··· NO UNDERFLOW
⑤ ··· OCCURRENCE OF UNDERFLOW
LOAD 1 ··· FEED LOAD SGL TO COUNTER,
        AND MOD. SGL→"1"
LOAD 2 ··· FEED LOAD SGL TO COUNTER,
        AND MOD. SGL→"0"
COUNT 1 ··· FEED COUNT-CLOCK TO COUNTER,
        AND MOD. SGL→"1"
COUNT 2 ··· FEED COUNT-CLOCK TO COUNTER,
        AND MOD. SGL→"0"

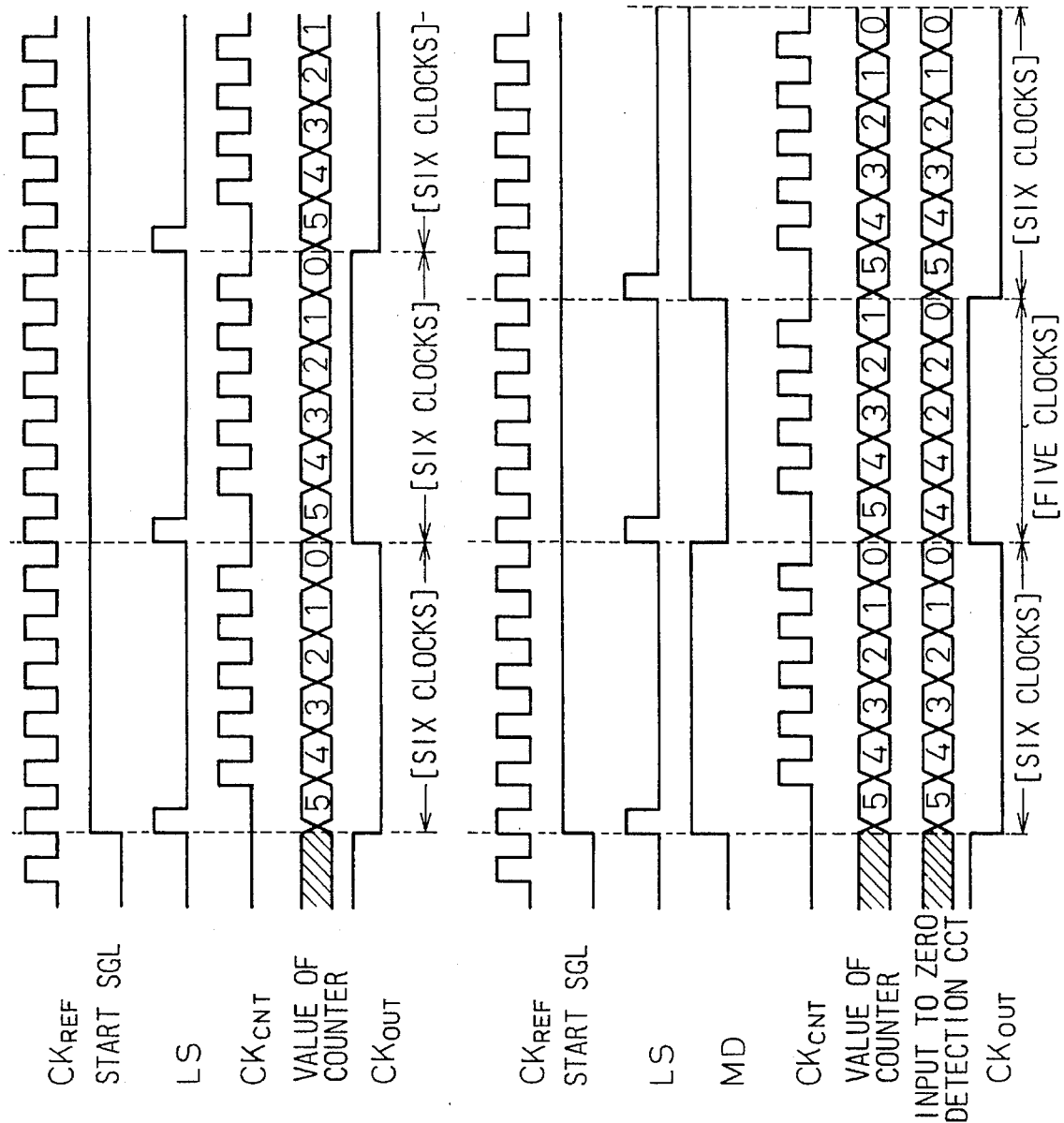

CLOCK SIGNAL GENERATING DEVICE

BACKGROUND OF THE INVENTION

1. Field of the Invention

The present invention relates to an art for generating a clock signal. More particularly, it relates to a device, for example, a programmable timer, for generating a clock signal, of which duty ratio is nearly 50%, on the basis of a reference clock in a communication system or the like.

2. Description of the Related Art

Along with an increase in the operating speed of microprocessors, efforts have been made to realize a higher transmission speed and improve the precision in control of a device. Accordingly, there is a growing demand for signals, such as communication clocks that have high frequencies and high precision. Signal generators employed are therefore required to be flexible enough to enable setting of an output frequency.

As far as a known programmable timer is concerned, a reference clock is fed to a timer unit. An output unit produces a clock output signal on the basis of the counting of the timer unit. According to this method, for generating an output wave whose duty ratio is, for example, about 50%, the timer unit is set to a period that is ½ of a cycle of a desired output wave. The logic level of an output is reversed according to a signal representing the result of the counting performed by the timer unit.

Whatever value is set in the timer unit, the cycle of a clock output signal produced is an even multiple of the pulse spacing of the reference clock (that is, an even number of pulse spacings of the reference clock).

As mentioned above, according to the known art for generating a clock signal, the cycle or frequency of a clock output signal produced is limited to an even multiple of pulse spacings of an input clock, that is, a reference clock. It is highly probable that the frequency of an actually-obtained clock output signal is different from the desired output frequency.

In particular, when it comes to higher frequencies, the frequency of an actually-obtainable clock output signal differs greatly from the desired output frequency. This poses a problem in that an ongoing demand for a high-precision clock signal to be employed in a communication system or the like cannot be met.

SUMMARY OF THE INVENTION

An object of the present invention is to provide a clock signal generating device which can minimize the deviation of an actual output frequency from a desired output frequency relative to an identical input clock and thus provide a high-precision output clock.

According to the present invention, there is provided a device for generating a clock signal comprising: a timer unit for generating a period signal that indicates a period defined on the basis of a reference clock and a period control signal; an output unit for reversing an output level thereof in response to the period signal produced by the timer unit and providing a resultant output as a clock signal; and a control unit for producing the period control signal according to the clock signal provided by the output unit and controlling a timing of generation of the period signal for the timer unit, whereby the cycle of the clock signal provided by the output unit is controlled so as to correspond to an odd number of pulse spacings of said reference clock.

BRIEF DESCRIPTION OF THE DRAWINGS

Other objects and features of the present invention will be described hereinafter in detail, by way of preferred embodiments, with reference to the accompanying drawings in which:

FIG. 3 is a block diagram showing the configuration of a first embodiment of the present invention;

FIG. 10 is an explanatory diagram showing state transitions manipulated by the control state machine shown in FIG. 9;

FIGS. 11a and 11b are timing charts describing the timing of actions and thus describing the operation of the device in FIG. 9;

FIG. 16 is an explanatory diagram showing state transitions manipulated by the control state machine shown in FIG. 15;

FIGS. 17a and 17b are timing charts describing the timing of actions and thus describing the operation of the device in FIG. 15;

FIGS. 20a and 20b are timing charts describing the actions and thus describing the operation of the device shown in FIG. 18.

DESCRIPTION OF THE PREFERRED EMBODIMENTS

Figure 1:
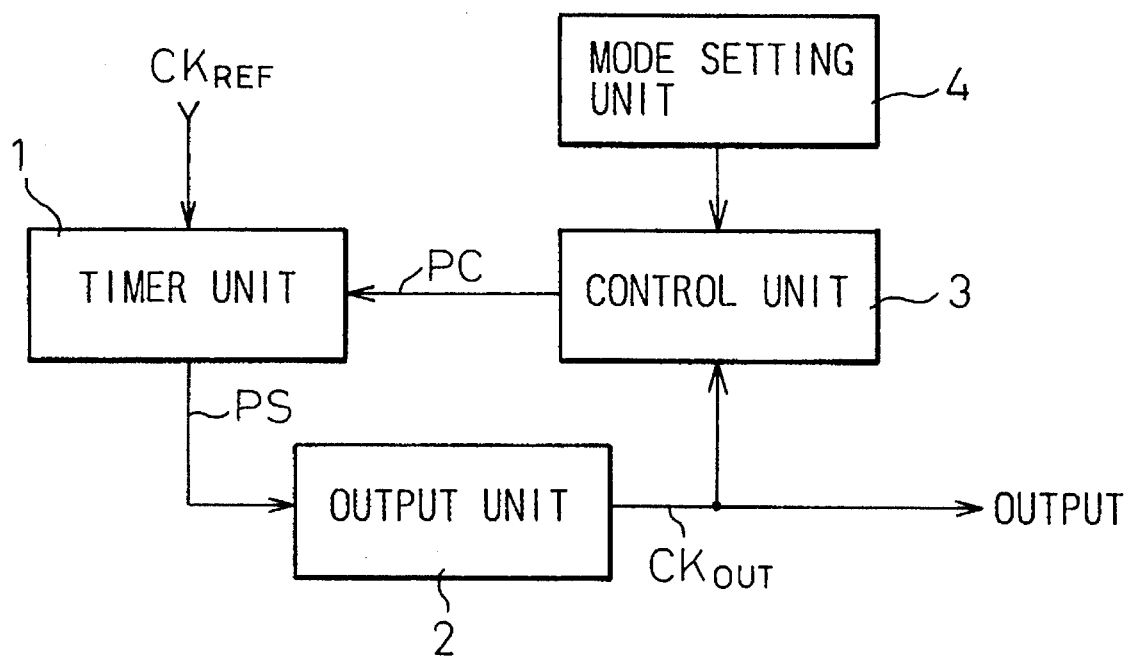
FIG. 1 is a block diagram showing the principle and configuration of a clock signal generating device in accordance with the present invention.

FIG. 1 shows an example of the principle and configuration of a clock signal generating device in accordance with the present invention.

In FIG. 1, reference numeral 1 denotes a timing unit for producing a period signal PS that indicates a period defined on the basis of a reference clock $CK_{REF}$ and period control signal PC. 2 denotes an output unit for reversing the logic level of an output thereof in response to the period signal produced by the timing unit 1. 3 denotes a control unit for producing the period control signal PC according to a clock signal provided by the output unit 2 and thus controlling the timer unit 1 in terms of the time of producing the period signal PS. The whole device illustrated uses the produced period control signal PC to control the cycle of a clock signal $CK_{OUT}$ provided by the output unit 2 so that the cycle of the clock signal $CK_{OUT}$ will correspond to an odd number of pulse spacings of the reference clock $CK_{REF}$.

Reference numeral 4 denotes a mode setting unit operably connected to the control unit 3. The mode setting unit 4 has the ability to specify the operating mode, relative to a cycle of the clock signal $CK_{OUT}$ provided by the output unit 2, by selecting either the even-number mode or the odd-number mode.

In a preferred embodiment of the present invention, when the odd-number mode is selected, the control unit 3 controls the timer unit 1 using the period control signal PC, and thus controls the output unit 2 so that a logical 0 period and logical 1 period within one cycle of the output clock signal $CK_{OUT}$ will be mutually different by an odd number of pulse spacings of the reference clock $CK_{REF}$.

In this case, the output unit 2 produces an output wave whose duty ratio is nearly 50% as the output clock signal $CK_{OUT}$.

In the preferred embodiment of the present invention, when the even-number mode is selected, the control unit 3 controls the timer unit 1 using the period control signal PC, and thus controls the output unit 2 so that the logical 0 period and logical 1 period within one cycle of the output clock signal $CK_{OUT}$ will be identical. In this case, the cycle of the output clock signal $CK_{OUT}$ corresponds to an even number of pulse spacings of the reference clock $CK_{REF}$.

Figure 2A:
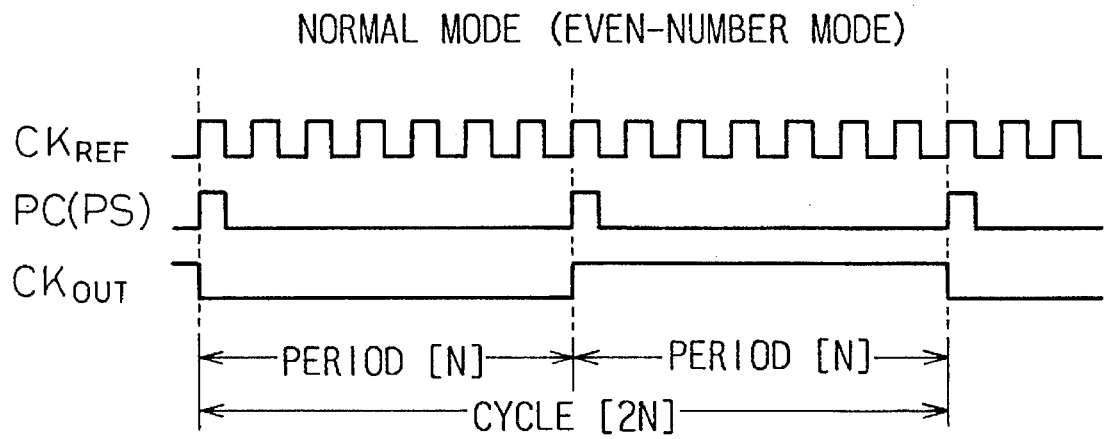
FIGS. 2a to 2c are timing charts describing the timing of actions and thus describing the operation of the device shown in FIG. 1.
Figure 2B:
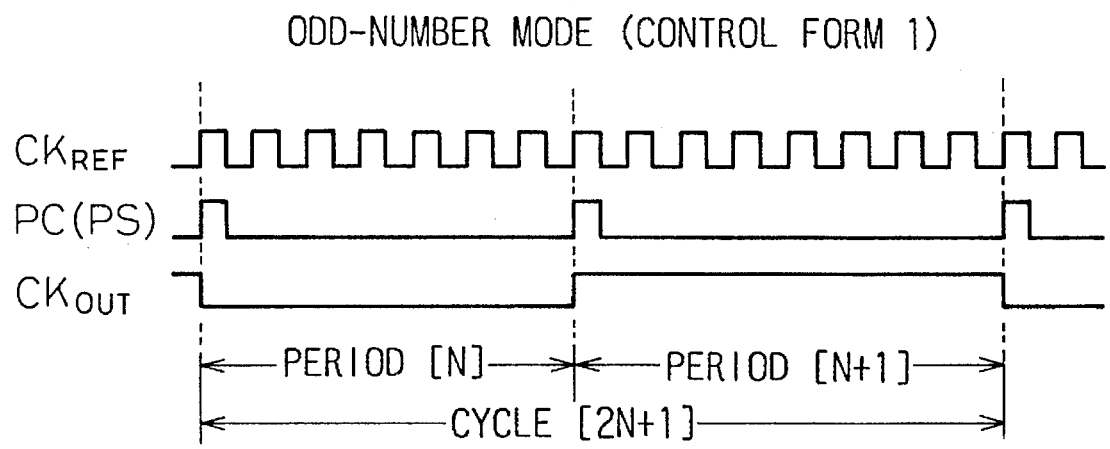
Figure 2C:
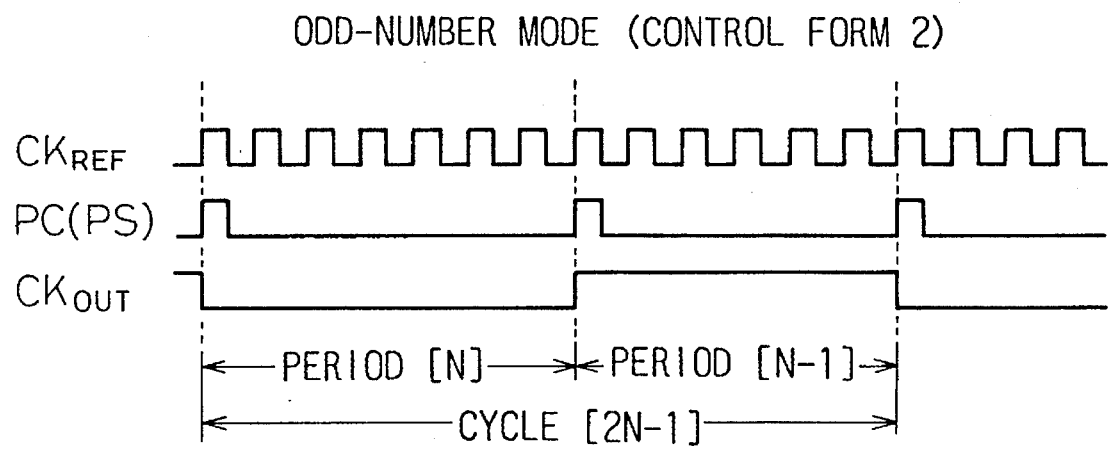

FIGS. 2a to 2c show examples of waveforms providing timing for actions to be performed in the device shown in FIG. 1.

FIG. 2a shows waveforms providing timing for actions to be performed when the normal mode or even-number mode is selected as the operating mode. FIGS. 2b and 2c show waveforms providing timing for actions to be performed when the odd-number mode is selected as the operating mode.

To begin with, in the normal mode shown in FIG. 2a, control is performed using the period control signal PC produced by the control unit 3 so that the logical 0 period and logical 1 period within one cycle of the output clock signal $CK_{OUT}$ will be identical or can be expressed as [N]. This means that the cycle of the output clock signal $CK_{OUT}$ corresponds to an even number of pulse spacings of the reference clock $CK_{REF}$ or is expressed as [2N].

In the odd-number mode shown in FIGS. 2b and 2c, control is performed using the period control signal PC so that the logical 0 period and logical 1 period within one cycle of the output clock signal $CK_{OUT}$ will be different by an odd number of pulse spacings (one pulse spacing in the illustrated example) of the reference clock $CK_{REF}$. In the example shown in FIG. 2b, the logical 0 period is longer by one pulse spacing of the reference clock $CK_{REF}$ (control form 1). By contrast, in the example shown in FIG. 2c, the logical 1 period is shorter by one pulse spacing of the reference clock $CK_{REF}$ (control form 2). In other words, the cycle of the output clock signal $CK_{OUT}$ corresponds to an odd number of pulse spacings of the reference clock $CK_{REF}$ and can be expressed as [2N+1] or [2N−1].

As mentioned above, in the clock signal generating device of the present invention, it is possible to set a cycle that corresponds to an even number of pulse spacings of the reference clock $CK_{REF}$ (See FIG. 2a). It is also possible to set a cycle that corresponds to an odd number of pulse spacings of the reference clock $CK_{REF}$ (See FIGS. 2b and 2c). The frequency of the output clock signal $CK_{OUT}$ can therefore be set to a quotient by an integer, of the frequency of the reference clock $CK_{REF}$.

Consequently, it becomes possible to minimize the difference between an actual output frequency and a desired output frequency relative to the same input clock that is the reference clock. This results in a high-precision output clock.

FIG. 3 shows an example of the configuration of the first embodiment of the present invention.

The illustrated example is equivalent to the configuration of a programmable timer 10. The programmable timer 10 is connected operably to a system bus 100 accommodated in a communication system to which the timer is adapted. In the timer 10, reference numeral 11 denotes a reload register for storing 16-bit data transferred in parallel over the system bus 100 (that is, data used to determine the number of pulse spacings of a reference clock that defines the logical 0 period or logical 1 period within one cycle of the output clock signal $CK_{OUT}$ produced last). 12 denotes a down-counter for reading 16-bit data from the reload register 11 and performing counting-down. 13 denotes a flip-flop for reversing the logic level of an output thereof in response to an underflow signal UF sent from the down-counter 12 and thus outputting the clock signal $CK_{OUT}$. 14 denotes a control state machine for producing a load signal LS and count clock $CK_{CNT}$ for use in controlling the action of the down-counter 12 according to the output clock signal $CK_{OUT}$, reference clock $CK_{REF}$, and mode signal MS. 15 denotes a mode register for outputting the mode signal MS used to specify the normal (even-number) mode or odd-number mode on the basis of operating mode information transferred over the system bus 100.

In comparison with the configuration shown in FIG. 1, the reload register 11 and down-counter 12 are comparable to the timer unit 1. The flip-flop 13 is comparable to the output unit 2. The control state machine 14 is comparable to the control unit 3. The mode register 15 is comparable to the mode setting unit 4.

Figure 4:
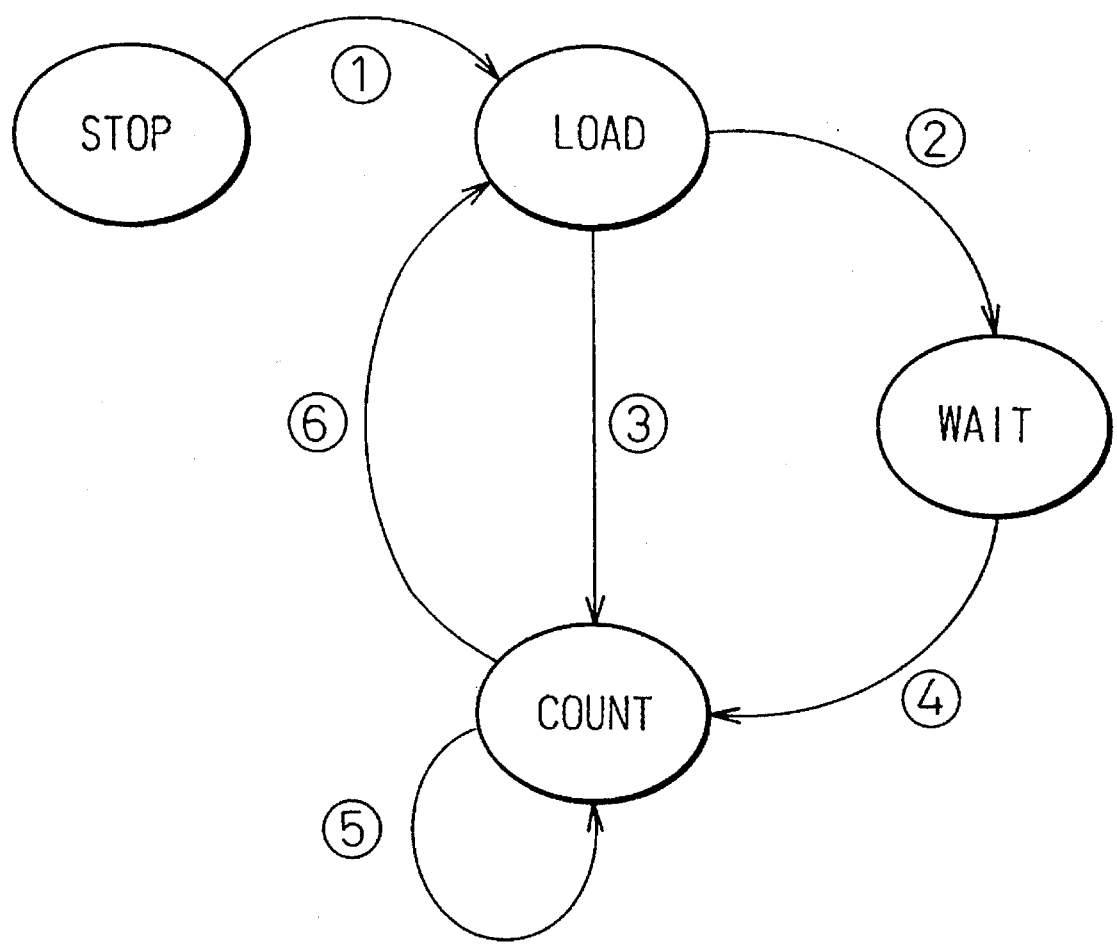
FIG. 4 is an explanatory diagram showing state transitions manipulated by the control state machine shown in FIG. 3.

FIG. 4 shows state transitions manipulated by the control state machine 14.

As shown in FIG. 4, when an output represents a 1 in odd-number mode (See state transition (2)), immediately after data is loaded from the reload register 11 onto the down-counter 12, a wait state is set up. Thereafter, counting-down is carried out. Consequently, the logical 1 period within one cycle of the output clock signal $CK_{OUT}$ becomes longer by a given number of pulse spacings (one pulse spacing) of the reference clock (control form 1 in FIG. 2b).

Figure 5:
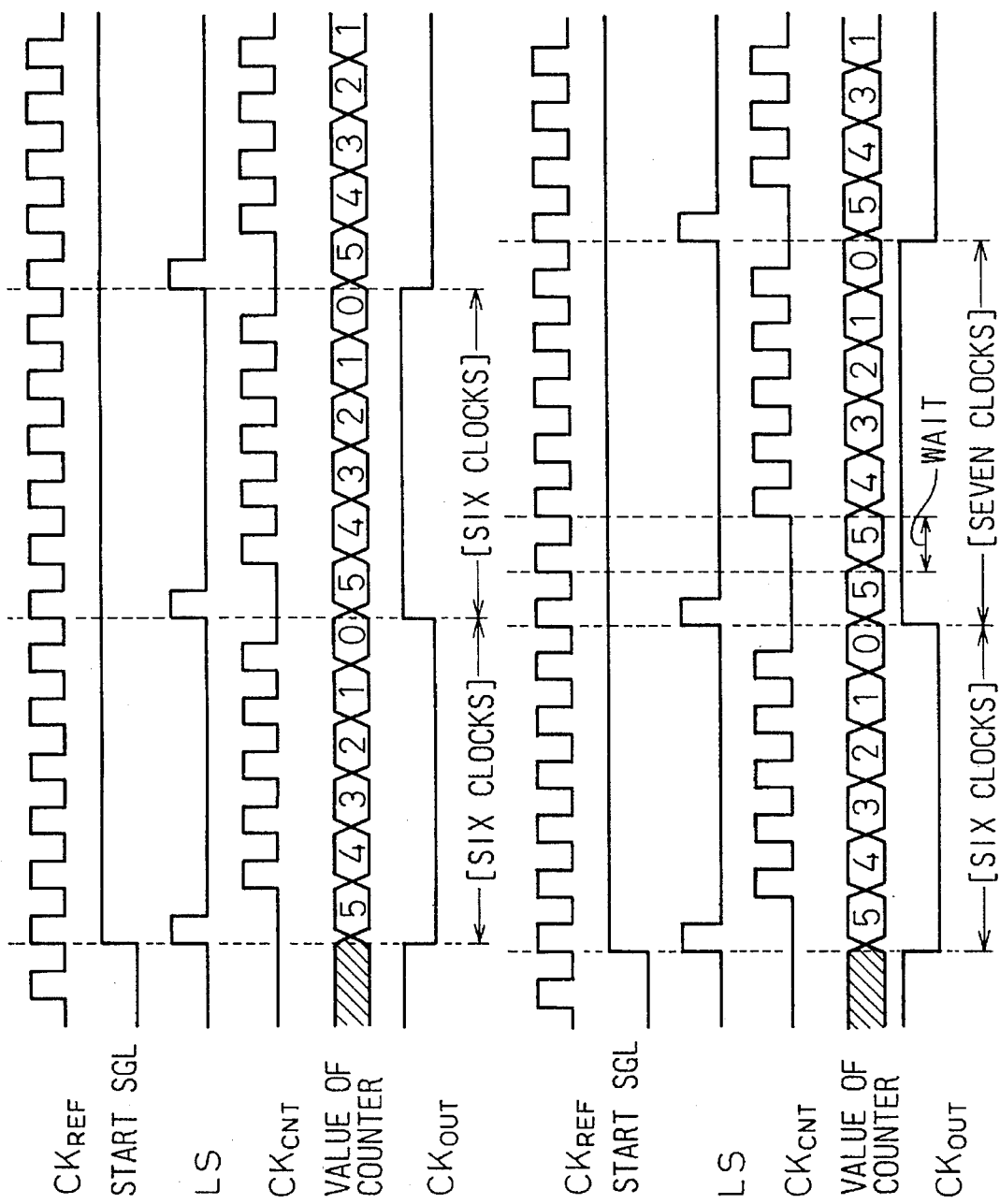
FIGS. 5a and 5b are timing charts describing the timing of actions and thus describing the operation of the device shown in FIG. 3.

FIGS. 5a and 5b show examples of waveforms providing timing of actions to be performed in the timer of this embodiment.

FIG. 5a shows waveforms providing timing of actions to be performed in normal (even-number) mode when a value 5 is set in the reload register 11. FIG. 5b shows waveforms providing timing of actions to be performed in odd-number mode when the value 5 is set in the reload register 11. In the drawings, the hatched areas indicate a state in which no value is set in the counter 12.

In the normal mode shown in FIG. 5a, the cycle of the output clock signal $CK_{OUT}$ corresponds to an even number of pulse spacings (12 pulse spacings in the illustrated example) of the reference clock $CK_{REF}$.

In the odd-number mode shown in FIG. 5b, a count clock $CK_{CNT}$ contains clock pulse during a pulse spacing created immediately after a pulse of the load signal during the logical 1 period of the output clock signal $CK_{OUT}$. The one pulse spacing serves as wait time. As a result, the cycle of the output clock signal $CK_{OUT}$ corresponds to an odd number of pulse spacings (13 pulse spacings in the illustrated example) of the reference clock $CK_{REF}$.

As mentioned above, this embodiment adopts such a control form that when the odd-number mode is set up, the logical 1 period of the output clock signal $CK_{OUT}$ is made longer by one pulse spacing of the reference clock.

In the aforesaid first embodiment (See FIGS. 3 to 5b), the reload register 11 and down-counter 12 are used to constitute a timer unit. The components of the timer unit are not limited to these two units but may be any other types of register and counter.

The control unit 3 (See FIG. 1) is provided in the form of the control state machine 14 for convenience sake. However, the control unit 3 need not be realized as a control state machine but may be any circuit that can produce the same functions or operations.

In the first embodiment, the logical 1 period of the output clock signal is made longer. Alternatively, the logical 0 period may be made longer.

Periods are mutually differentiated by extending one period. Alternatively, periods may be mutually differentiated by shortening one period or by extending or shortening one period.

A difference between periods is comparable to one pulse spacing of a reference clock in the first embodiment. Needless to say, as long as the number of pulse spacings thereof is odd, the difference may be comparable to three or five pulse spacings of the reference clock.

In the first embodiment, for differentiating one period of an output clock signal from another, a wait time is set in a counter. The present invention is not restricted to this control form. Alternatively, a value indicating start or end of counting, or counting itself may be manipulated in order to differentiate one period of an output clock signal from another.

Other embodiments will be described with reference to FIGS. 6 to 20.

Figure 6:
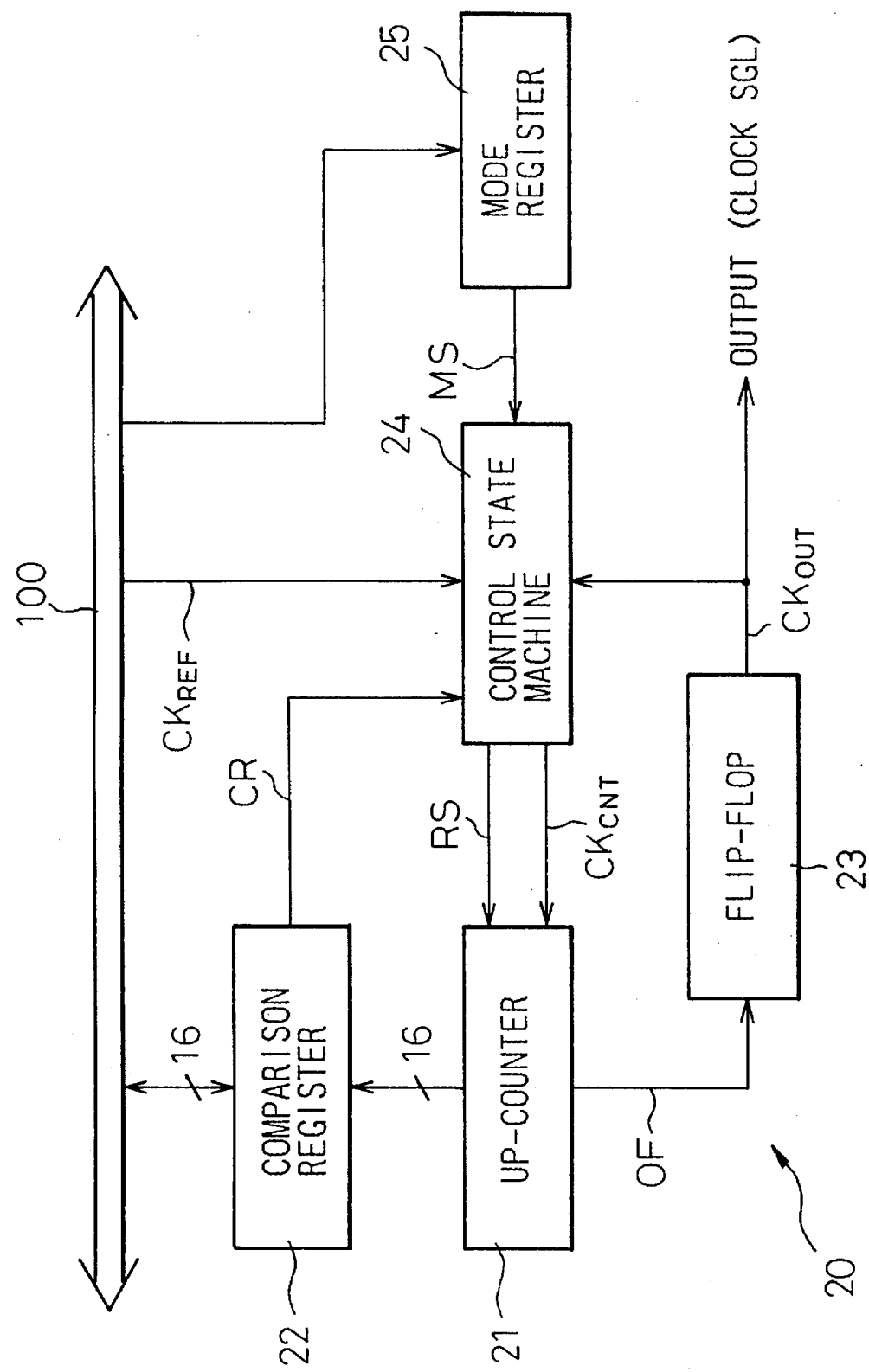
FIG. 6 is a block diagram showing the configuration of a second embodiment of the present invention.

FIG. 6 shows the configuration of a programmable timer 20 in accordance with the second embodiment of the present invention. Differences in configuration from the timer of the first embodiment shown in FIG. 3 are that (1) an up-counter 21 is included instead of the down-counter 12 and that (2) a comparison register 22 is included instead of the reload register 11.

In this embodiment, an overflow signal OF sent from the up-counter 21 is used to control a flip-flop 23. A reset signal RS and count clock $CK_{CNT}$ are used to control the action of the up-counter 21. A control state machine 24 responds not only to an output clock signal $CK_{OUT}$, reference clock $CK_{REF}$, and mode signal MS but also to a signal CR representing a result of comparison made by the comparison register 22, and then carries out the predetermined counter control.

The actions performed in the timer of the second embodiment are readily inferred from those performed in the timer of the first embodiment. No mention will therefore be made of the actions.

Figure 7:
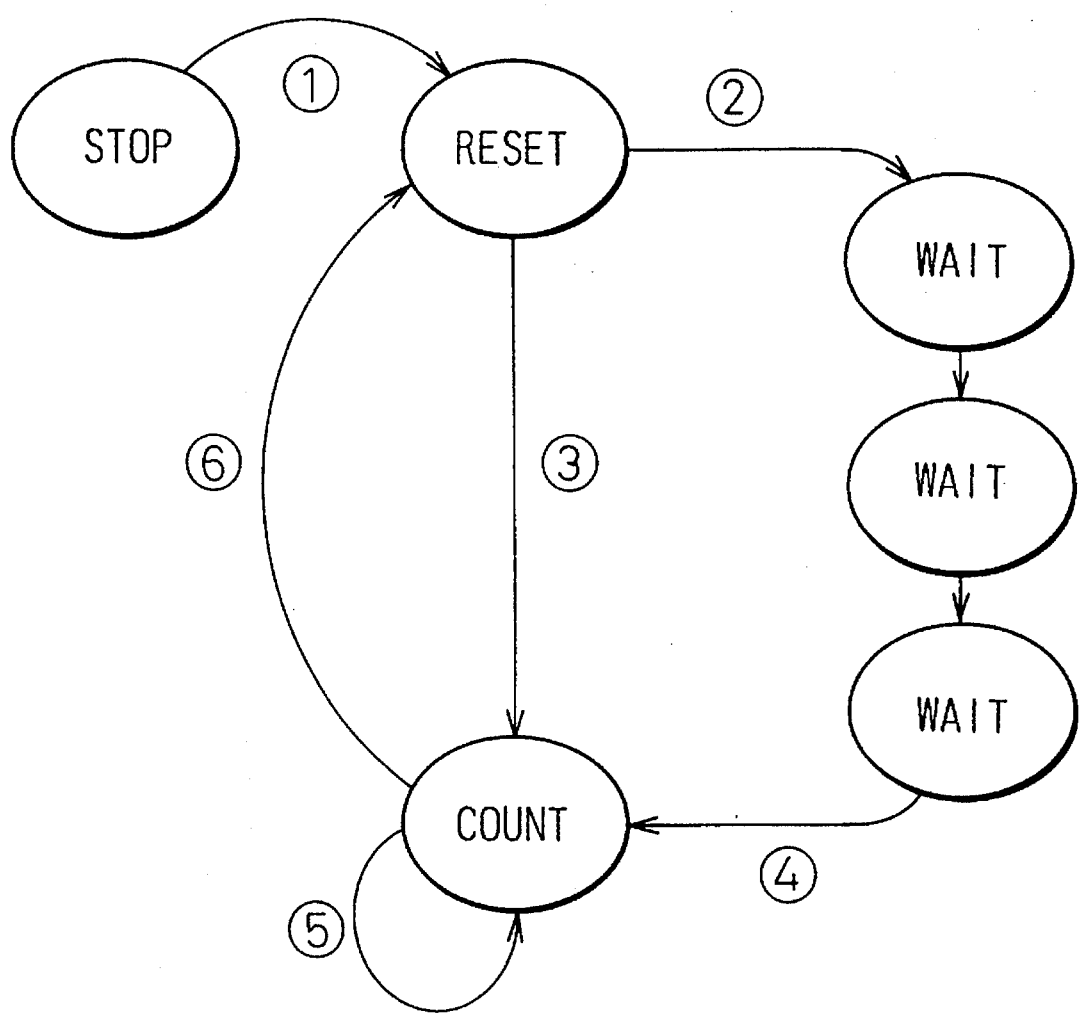
FIG. 7 is an explanatory diagram showing state transitions manipulated by the control state machine in FIG. 6.
Figure 8:
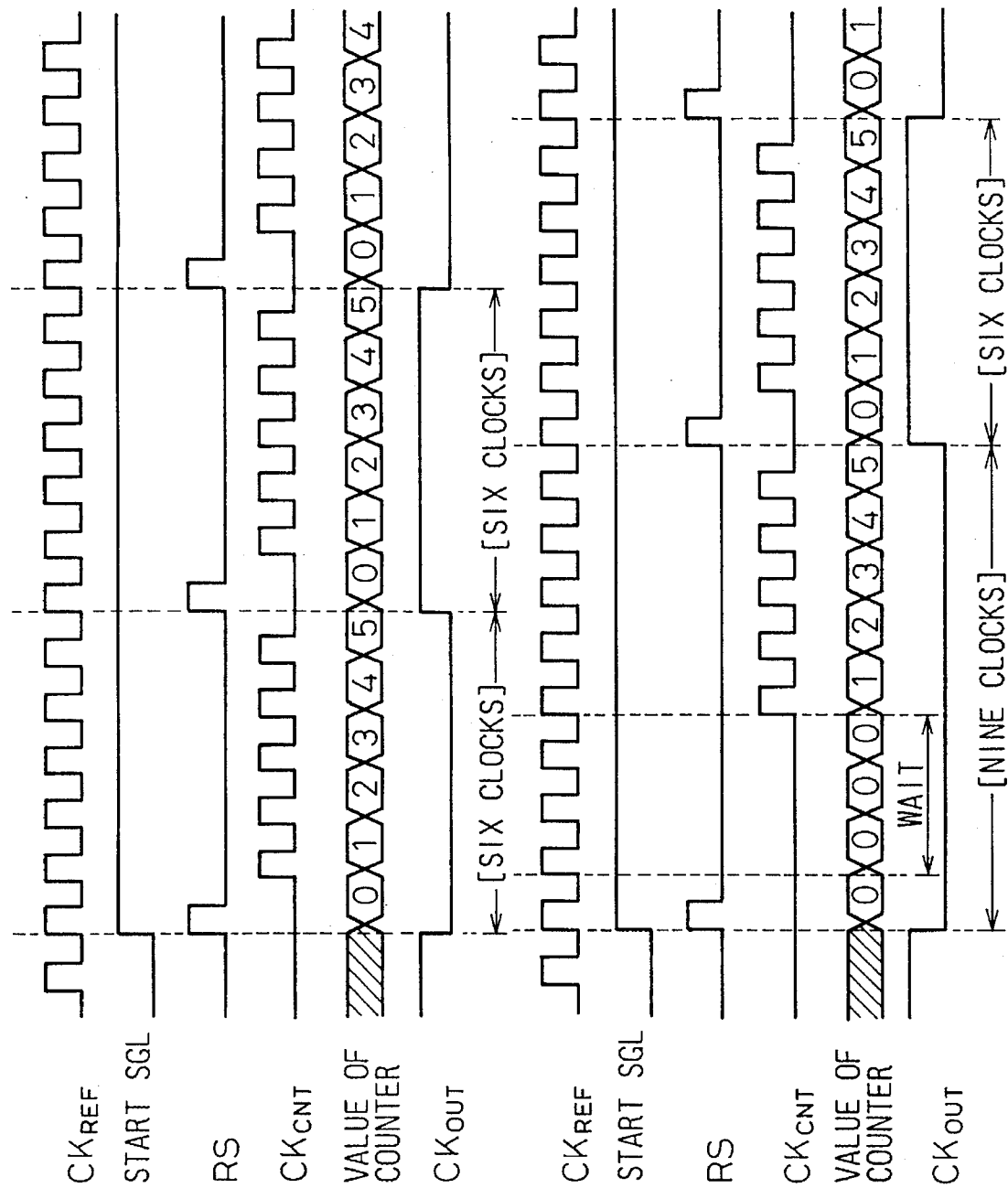
FIGS. 8a and 8b are timing charts describing the timing of actions and thus describing the operation of the device shown in FIG. 6.

In the same way that the state transitions manipulated by the control state machine in the first embodiment are shown in FIG. 4, the state transitions manipulated by a control state machine 24 in the second embodiment are shown in FIG. 7. FIGS. 8a and 8b show examples of waveforms providing timing for actions.

In the second embodiment, control is performed so that, in the odd-number mode, the logical 0 period of an output clock signal is extended by three pulse spacings of a reference clock.

Figure 9:
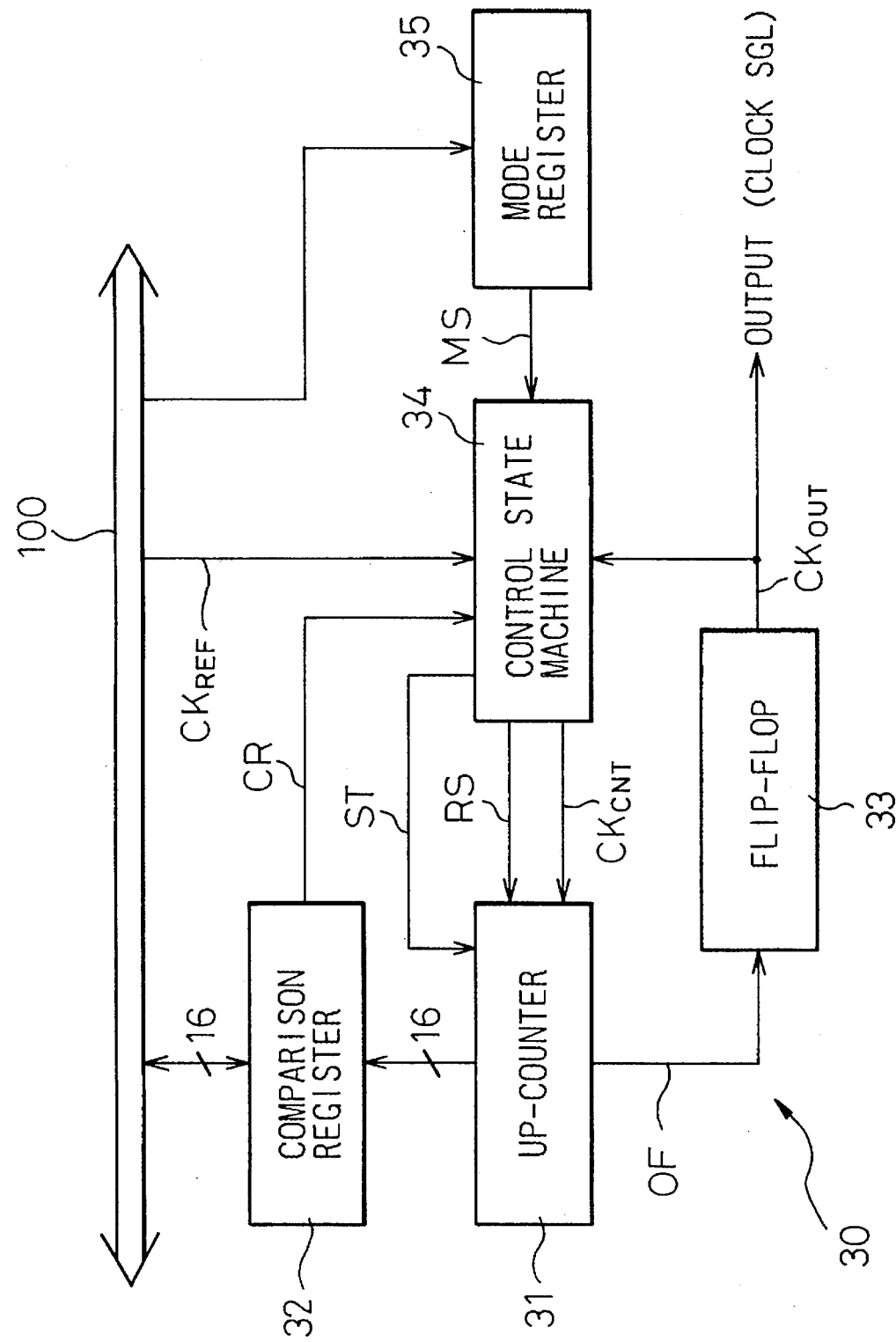
FIG. 9 is a block diagram showing the configuration of a third embodiment of the present invention.

FIG. 9 shows the configuration of a programmable timer 30 in accordance with the third embodiment of the present invention. The difference in the configuration from the timer of the second embodiment shown in FIG. 6 is that a control state machine 34 supplies a set signal ST so as to set a value 1 in an up-counter 31 as a value indicating the start of counting.

In the same way that the state transitions manipulated by the control state machines in the aforesaid embodiments are shown in FIGS. 4 and 7 respectively, so the state transitions manipulated by a control state machine 34 in the third embodiment are shown in FIG. 10. FIGS. 11a and 11b show examples of waveforms providing timing for actions.

In the third embodiment, control is performed so that, in the odd-number mode, a value indicating the start of counting, which is performed to define the logical 1 period of an output clock signal, is set to 1. In other words, the value indicating the start of counting is manipulated in order to differentiate one period of the output clock signal from another.

Figure 12:
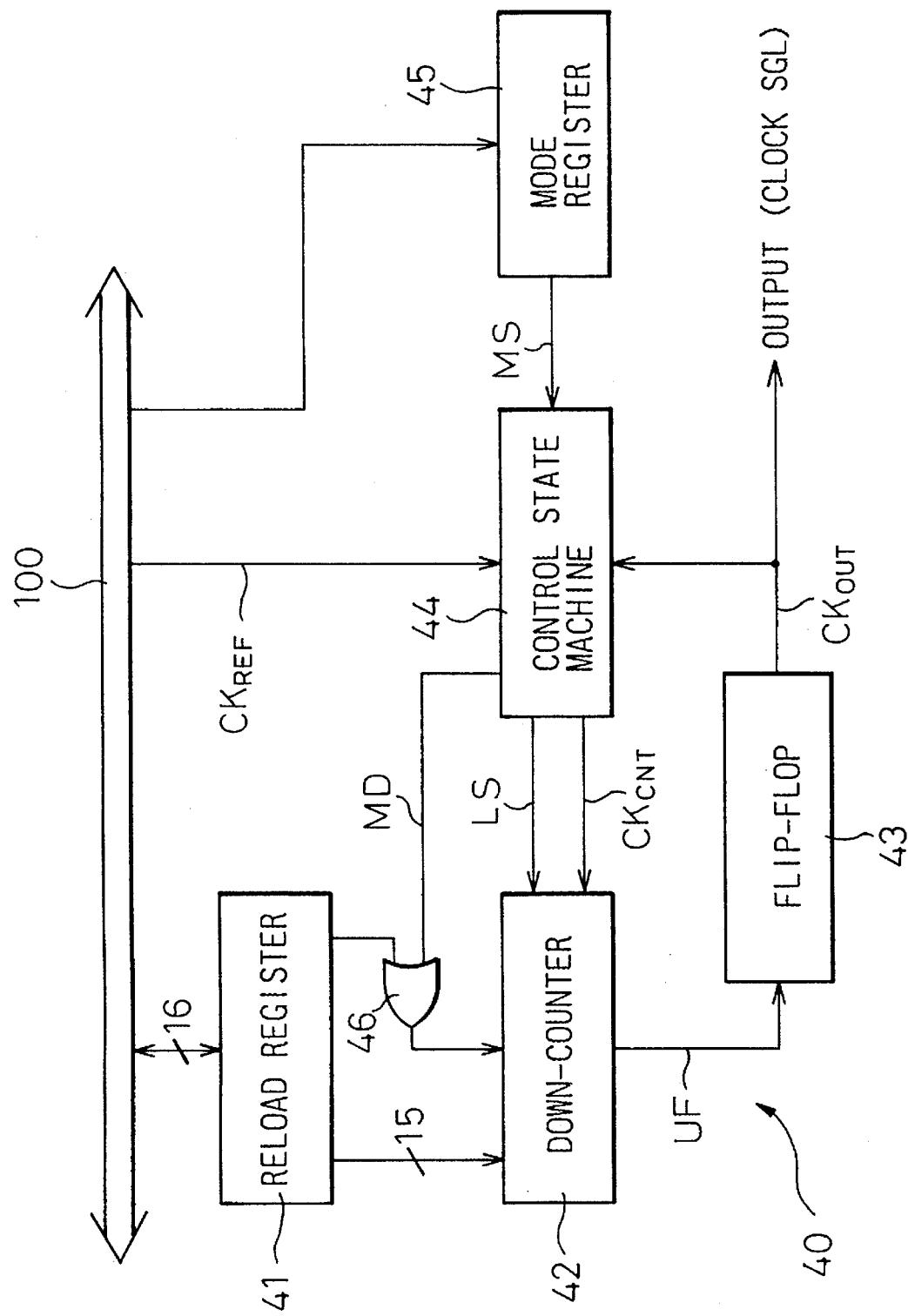
FIG. 12 is a block diagram showing the configuration of a fourth embodiment of the present invention.

FIG. 12 shows the configuration of a programmable timer 40 in accordance with the fourth embodiment of the present invention. The difference in the configuration from the timer of the first embodiment shown in FIG. 3 is that an OR gate 46 responding to a 0-bit signal sent from a reload register 41 and a modifier signal MD sent from a control state machine 44 is installed at a stage preceding a down-counter 42. The modifier signal MD is used to forcibly set bit 0, that is data to be loaded into the down-counter 42, to a 1.

Figure 13:
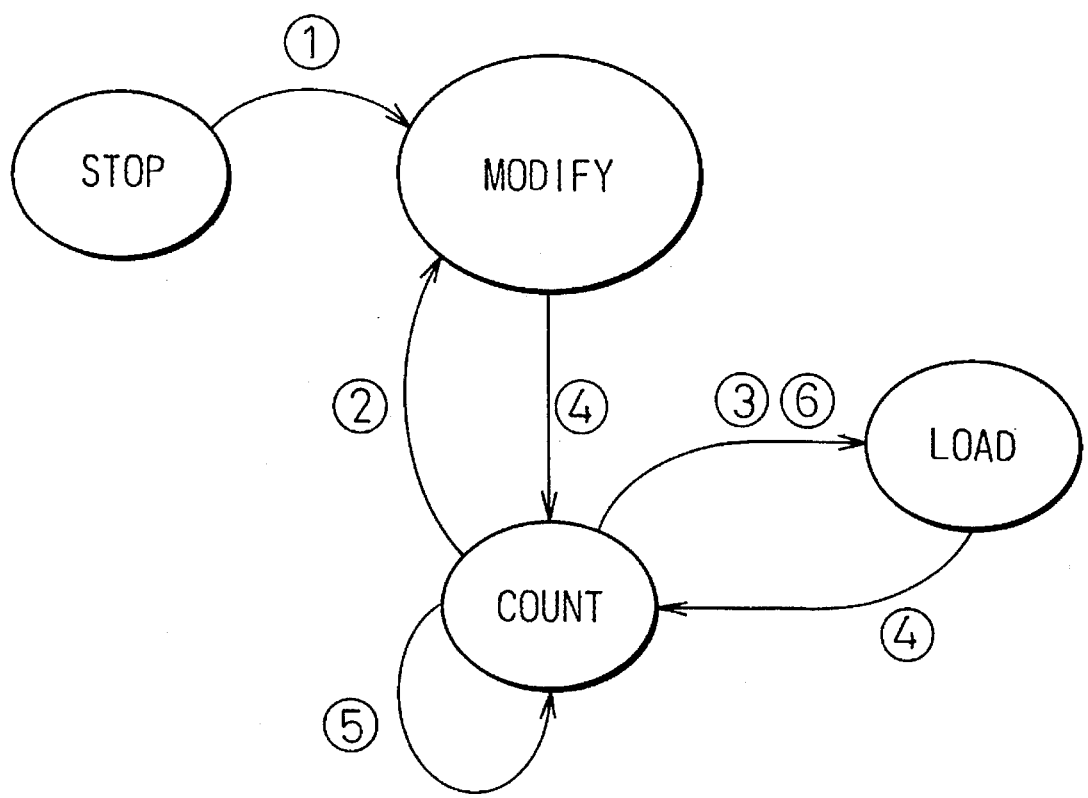
FIG. 13 is an explanatory diagram showing state transitions manipulated by the control state machine shown in FIG. 12.
Figure 14:
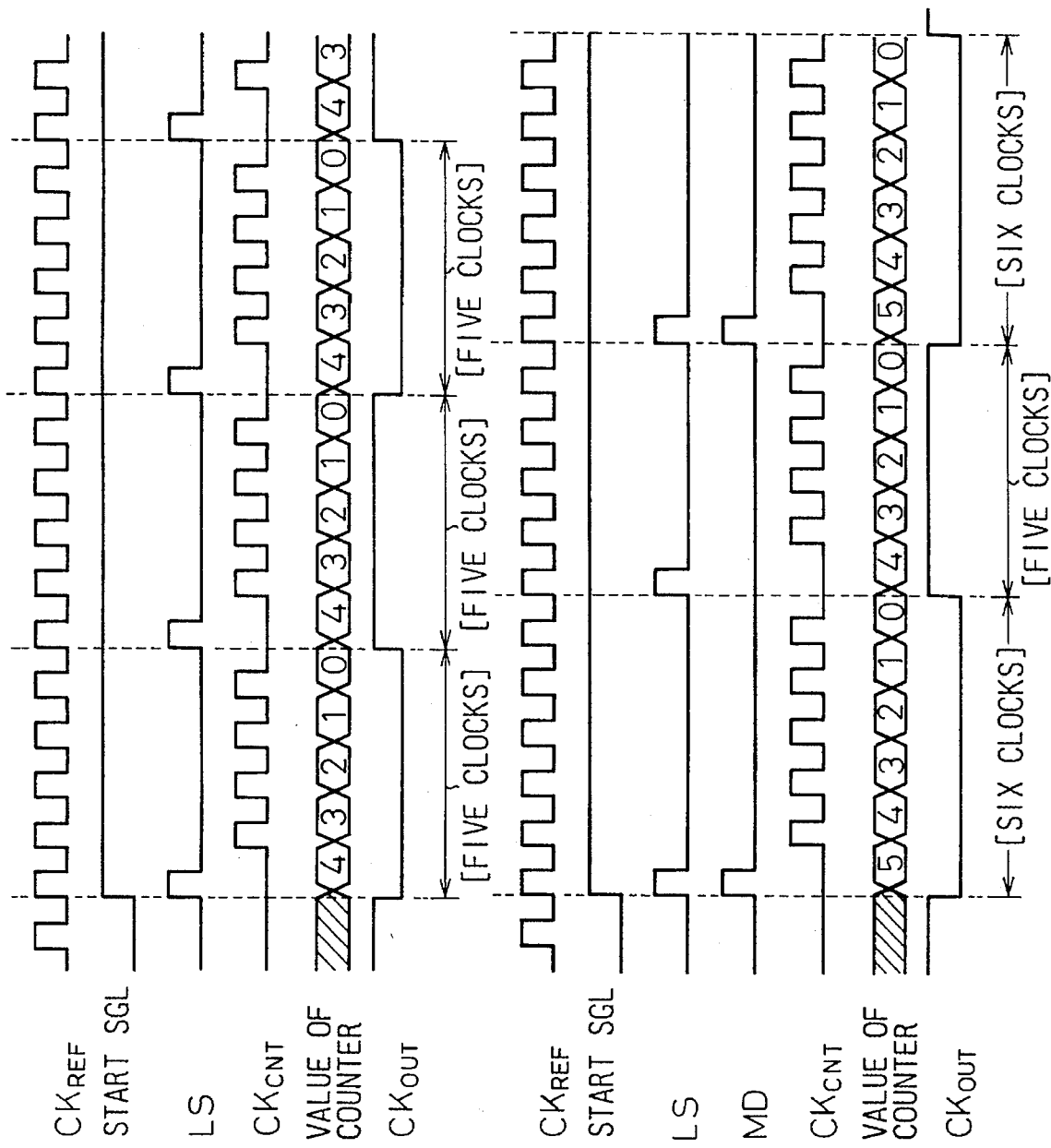
FIGS. 14a and 14b are timing charts describing the timing of actions and thus describing the operation of the device in FIG. 12.

In the same way that the state transitions manipulated by the control state machines in the aforesaid embodiments are shown in the respective drawings, so the state transitions manipulated by a control state machine 44 in the fourth embodiment are shown in FIG. 13. FIGS. 14a and 14b show examples of waveforms providing timing for actions.

In the fourth embodiment, control is performed so that, in the odd-number mode, bit 0 to be loaded for defining the logical 0 period of an output clock signal is forcibly set to a 1. When a set value in a reload register 41 is even, it becomes possible to set a cycle corresponding to an odd number of pulse spacings of a reference clock. In other words, a value indicating the start of counting is manipulated in order to differentiate one period of the output clock signal from another.

Figure 15:
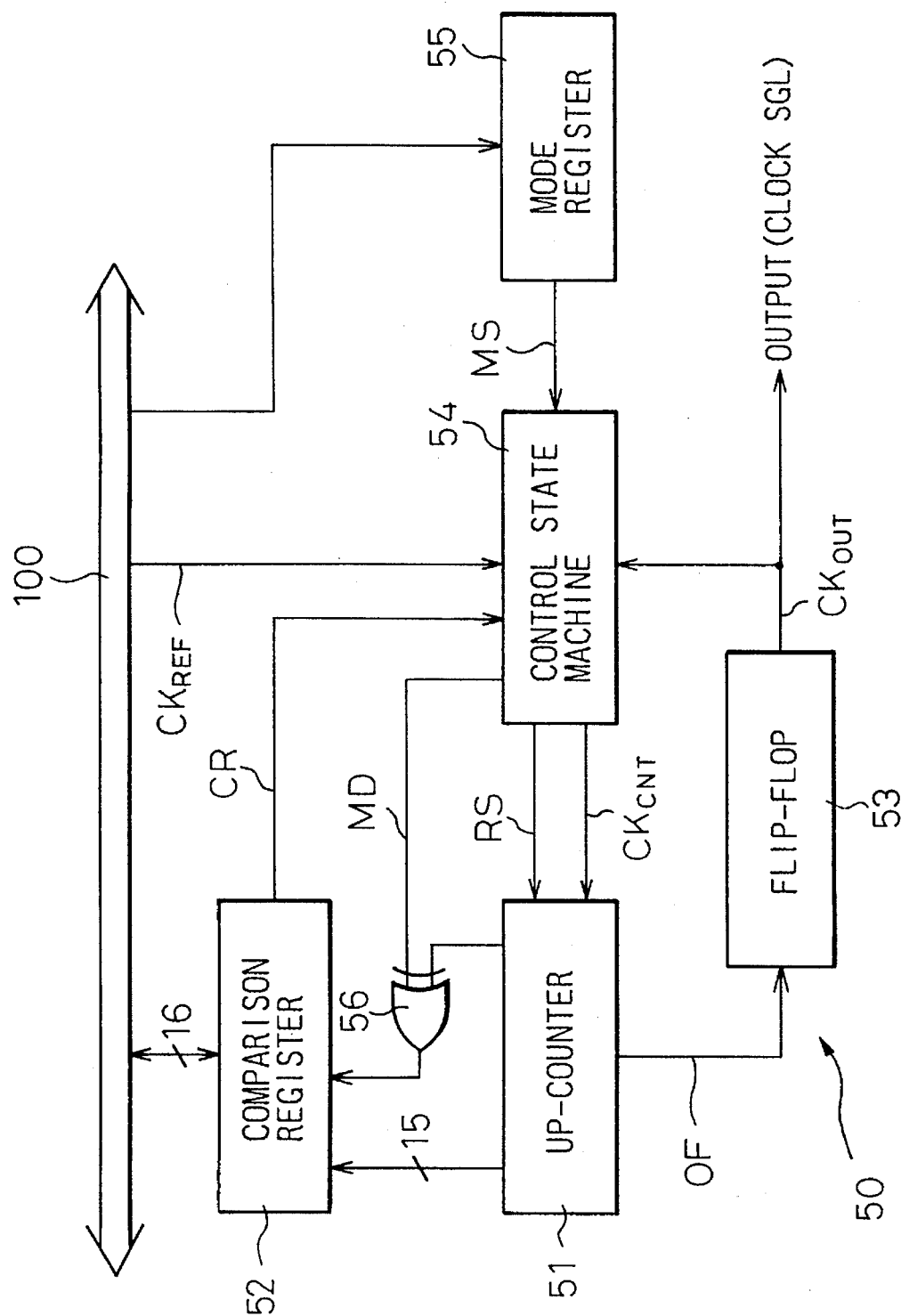
FIG. 15 is a block diagram showing the configuration of a fifth embodiment of the present invention.

FIG. 15 shows the configuration of a programmable timer 50 in accordance with the fifth embodiment of the present invention. The differences in the configuration from the timer of the third embodiment shown in FIG. 9 are that an exclusive OR gate 56 responding to a 0-bit signal sent from an up-counter 51 and a modifier signal MD sent from a control state machine 54 is installed at a stage preceding a comparison register 52 and that a set signal ST is not used. The modifier MD is used to invert the bit 0 that is data to be set into the comparison register 52.

In the same way that the state transitions manipulated by the control state machines in the aforesaid embodiments are shown in the respective drawings, so the state transitions manipulated by a control state machine 54 in the fifth embodiment are shown in FIG. 16. FIGS. 17a and 17b show examples of waveforms providing timing for actions.

In the fifth embodiment, control is performed so that, in the odd-number mode, bit 0 that is data to be fed to the comparison register 52 for defining the logical 0 period of an output clock signal is inverted. When a set value in the comparison register 52 is even, it becomes possible to set a cycle corresponding to an odd number of pulse spacings of a reference clock. In other words, a value indicating the end of counting is manipulated in order to differentiate one period of the output clock signal from another.

Figure 18:
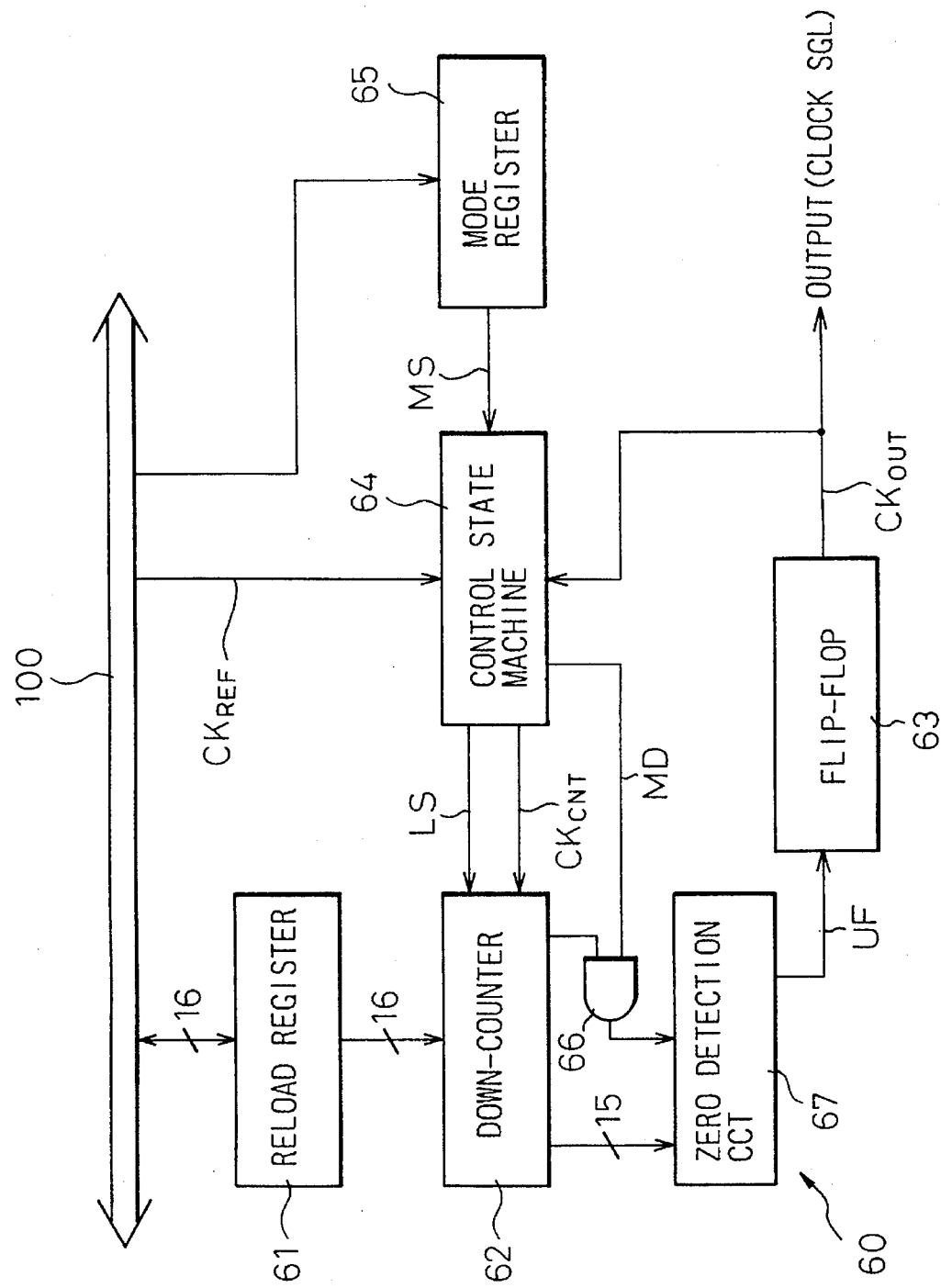
FIG. 18 is a block diagram showing the configuration of a sixth embodiment of the present invention.

FIG. 18 shows the configuration of a programmable timer 60 in accordance with the sixth embodiment of the present invention. The differences in the configuration from the timer of the fourth embodiment shown in FIG. 12 are that (1) an AND gate 66 responding to a 0-bit signal sent from a down-counter 62 and a modifier signal MD sent from a control state machine 64 is included instead of the OR gate 46, and that (2) a zero detection circuit 67 for providing an underflow signal UF in response to a 15-bit signal sent from a down-counter 62 and an output signal from an AND gate 66 is included. The modifier signal MD is used to forcibly set bit 0, that is data to be fed to the zero detection circuit 67 to 0.

Figure 19:
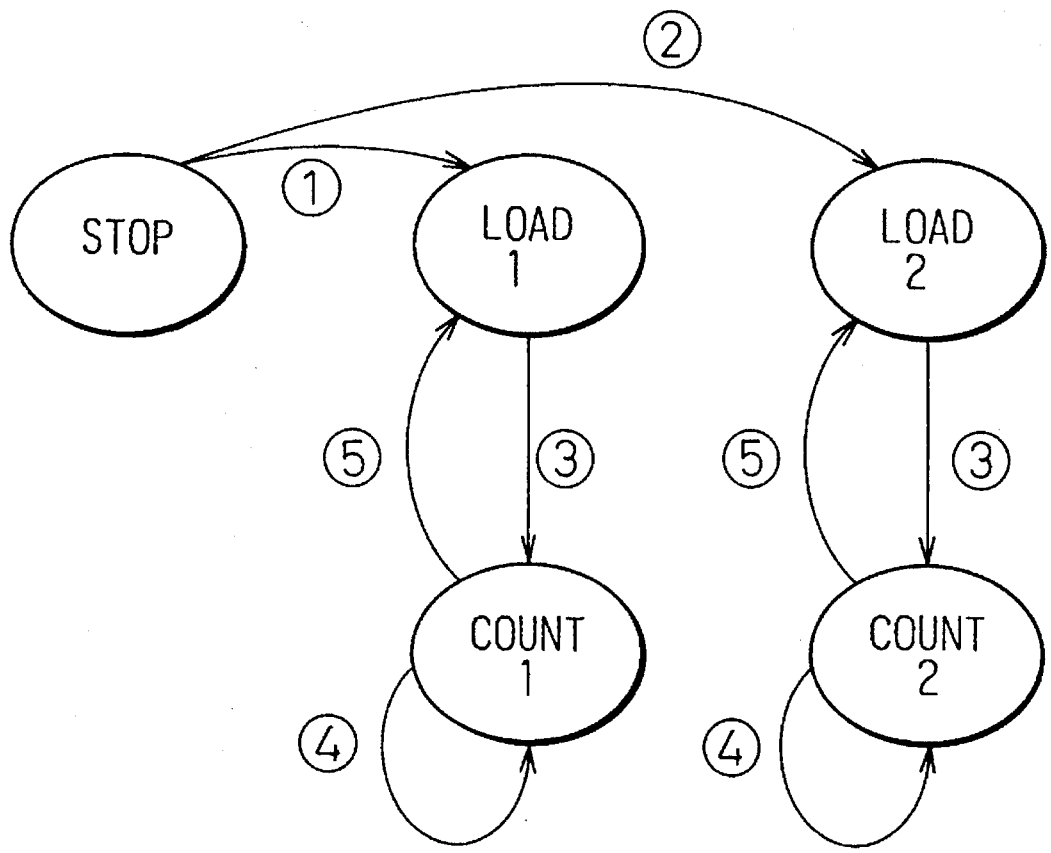
FIG. 19 is an explanatory diagram showing state transitions manipulated by the control state machine shown in FIG. 18.

In the same way that the state transitions manipulated by the control state machines in the aforesaid embodiments are shown in the respective drawings, so the state transitions manipulated by a control state machine 64 in the sixth embodiment are shown in FIG. 19. FIGS. 20a and 20b show examples of waveforms providing timing for actions.

In the sixth embodiment, control is performed so that in the odd number mode, bit 0, that is data to be fed to the zero detection circuit 67 for defining the logical 1 period of an output clock signal, is forcibly set to 0. When the set value in a reload register 61 is odd, it becomes possible to set a cycle corresponding to an odd number of pulse spacings of a reference clock. In other words, a value indicating the end of counting is manipulated in order to differentiate one period of the output clock signal from another.

What is claimed is:

1. A device for generating a clock signal, comprising:
   a timer unit for generating a period signal that indicates a period defined on the basis of a reference clock and a period control signal;
   an output unit for reversing an output level thereof in response to said period signal generated by said timer unit and providing a resultant output as a clock signal; and
   a control unit for producing said period control signal, according to said clock signal output from said output unit, and controlling the timing of generation of said period signal for said timer unit,
   whereby a cycle of said clock signal output from said output unit is controlled so as to correspond to an odd number of pulse spacings of said reference clock.

2. The device as set forth in claim 1, further comprising means, operatively connected to said control unit, for setting an operating mode relative to a period of said clock signal output from said output unit by selecting either an odd-number mode or an even-number mode.

3. The device as set forth in claim 2, wherein when said odd-number mode is selected, said control unit controls said timer unit using said period control signal and thus controls said output unit so that a logical "0" period and a logical "1" period within one cycle of an output clock signal are mutually different by an odd number of pulse spacings of said reference clock.

4. The device as set forth in claim 3, wherein said output unit provides a clock signal whose duty ratio is approximately 50%.

5. The device as set forth in claim 2, wherein when said even-number mode is selected, said control unit controls said timer unit using said period control signal and thus controls said output unit so that a logical "0" period and a logical "1" period within one cycle of an output clock signal are mutually identical.

\* \* \* \* \*